United States Patent [19]
Hurwitt

[11] Patent Number: 5,569,361
[45] Date of Patent: Oct. 29, 1996

[54] METHOD AND APPARATUS FOR COOLING A SPUTTERING TARGET

[75] Inventor: Steven Hurwitt, Park Ridge, N.J.

[73] Assignees: Sony Corporation, Tokyo, Japan; Materials Research Corporation, Orangeburg, N.Y.

[21] Appl. No.: 398,743

[22] Filed: Mar. 6, 1995

[51] Int. Cl.$^6$ .................................................. C23C 14/34
[52] U.S. Cl. .............................. 204/192.12; 204/298.09
[58] Field of Search .......................... 204/192.12, 298.09

[56] References Cited

U.S. PATENT DOCUMENTS

| | | | |
|---|---|---|---|
| 5,130,005 | 7/1992 | Hurwitt et al. | 204/192.12 |
| 5,171,415 | 12/1992 | Miller et al. | 204/298.09 |
| 5,180,478 | 1/1993 | Hughes | 204/298.09 |
| 5,372,333 | 12/1994 | Uwira et al. | 244/3.16 |

FOREIGN PATENT DOCUMENTS

| | | | |
|---|---|---|---|
| 0492992A2 | 7/1992 | European Pat. Off. | 204/298.09 |
| 63-42369 | 2/1988 | Japan | 204/298.09 |
| 63-100175 | 5/1988 | Japan | 204/298.09 |

*Primary Examiner*—Aaron Weisstuch
*Attorney, Agent, or Firm*—Wood, Herron & Evans

[57] ABSTRACT

Method and apparatus for cooling a sputtering target is provided. The method comprises the steps of providing a sputtering target and a cooling surface in operable conductive heat transfer contact with the sputtering target, introducing a cooling liquid onto the cooling surface to conductively remove heat from the sputtering target, allowing at least a portion of the cooling liquid to change phase into a vapor, and preventing a continuous insulating vapor layer from forming on the cooling surface to ensure continuing conductive heat transfer from the target to the cooling surface so as to avoid overheating of the target. The apparatus comprises a cooling surface in operable conductive heat transfer contact with the sputtering target to conductively remove heat from the target when a cooling liquid is introduced onto the cooling surface, and means for allowing at least a portion of the cooling liquid to change phase into a vapor while preventing a continuous insulating vapor layer from forming on the cooling surface to ensure continuing conductive heat transfer from the target to the cooling surface so as to avoid overheating of the target.

41 Claims, 3 Drawing Sheets

METHOD AND APPARATUS FOR COOLING A SPUTTERING TARGET

FIELD OF THE INVENTION

This invention relates generally to cathode sputtering, and more particularly to method and apparatus for cooling a sputtering target mounted on a cathode sputtering assembly during sputtering of the target.

BACKGROUND OF THE INVENTION

In a sputtering deposition process, substrates to be sputter coated with a thin deposited film are positioned adjacent to a sputtering target, which is the source of the coating material, in a processing chamber. Pressure in the chamber is reduced to a near vacuum level and negative voltage is applied to the target. The resulting plasma discharge, which may be magnetically confined and intensified, creates large quantities of positive ions which bombard the target and separate atoms from the surface of the target. These atoms of target material travel to the adjacent substrate surface, forming a coating of target material.

In this process, the bombarding ions, in addition to separating atoms from the target surface, deliver energy into the target which results in heating of the target. Generally, about ninety percent of the electrical power applied to the plasma is converted to heating of the target. With commonly used power densities in the range of 30,000 Watts per square foot of target area, aggressive cooling is required to prevent melting or cracking of the target and to protect the target supporting cathode and adjacent structures from overheating.

The commonly used technique for achieving this cooling is to flow water against the back face of the sputtering target, or against the backing plate to which the target is firmly attached. Water is introduced through an inlet pipe to the cathode assembly. The water flows to and through a cooling area around a magnet structure adjacent the rear face of the target (or back plate) and then exits through an outlet pipe. Heat is thus extracted from the target assembly by conduction to the water. In some designs the target supporting cathode structure is water cooled, with the target being firmly attached to the cathode structure during use. Because production sputtering systems frequently operate twenty-four hours per day and may contain three to twelve cathodes operating simultaneously, the consumption of water required to provide the necessary cooling represents a significant expense in the operation of the system. The required quantity of water is determined by the amount of heat to be extracted, the specific heat of water, and the allowable temperature rise in the water.

An example of calculated water flow requirements is:

Power to Plasma=30,000 watts

Power to Target as Heat (90%)=27,000 watts

BTU/Hour=27,000 watts×3.41 BTU/Hour/watt=92,070 BTU/Hour

With an allowable water temperature increase of 30° F. (70° inlet and 100° outlet), and a specific heat for water of 1.0 BTU/Pound/°F., the extraction of 92,070 BTU/Hour requires:

$$\frac{92{,}070 \text{ BTU/Hour}}{30° \text{ Temp. Rise}} = \frac{3069 \text{ BTU/Hour/°F.}}{1.0 \text{ BTU/Pound/°F.}} = \frac{3069 \text{ Pounds}}{\text{of Water/Hour}}$$

At 8.34 Lbs/Gallon, the water flow is:

$$\frac{3069 \text{ Pounds/Hour}}{8.34 \text{ Pounds/Gallon}} = 368 \text{ Gallons/Hour}$$

The efficiency of utilization of this water is expressed as:

$$\frac{92{,}070 \text{ BTU/Hour}}{368 \text{ Gallons/Hour}} = 250.2 \text{ BTU/Gallon}$$

In the conventional sputtering cathode described above, the capacity of the cooling water for heat absorption is limited by the specific heat value of 1.0 BTU/Pound/°F. which is substantially constant for water in its liquid phase. When water boils, however, and changes phase from liquid to vapor, the latent heat of vaporization of 970 BTU/Pound adds significantly to the heat absorption capability of a given amount of water.

Under these conditions, the equivalent cooling calculation is:

BTU/Hour to be extracted = 92,070
Liquid Phase: (212° − 70°) × 1.0 (specific heat) = 142 BTU/Pound
Transition to vapor at 212° = +970 BTU/Pound
TOTAL 1112 BTU/Pound $$\frac{92{,}070 \text{ BTU/Hour}}{1112 \text{ BTU/Pound}} = 82.8 \text{ Pounds/Hour}$$

$$\frac{82.8 \text{ Pounds/Hour}}{8.34 \text{ Pounds/Gallon}} = 9.9 \text{ Gallons/Hour}$$

Efficiency of Utilization $= \frac{92{,}070 \text{ BTU/Hour}}{9.9 \text{ Gallons/Hour}}$
$= 9{,}300 \text{ BTU/Gallon}$ The reduction in water quantity required compared to conventional cathode assemblies discussed above (from 368 gallons per hour to 9.9 gallons per hour) is made possible by utilizing the latent heat of vaporization of the water in addition to the usual specific heat value. In order to make this practically functional in a sputtering cathode, however, the conversion of liquid water to vapor must be accomplished in a controlled manner. Simply reducing water flow and allowing vapor generation creates an insulating vapor layer adjacent the cooling surface of the target which inhibits further heat flow and permits overheating of the target.

Figure 1:
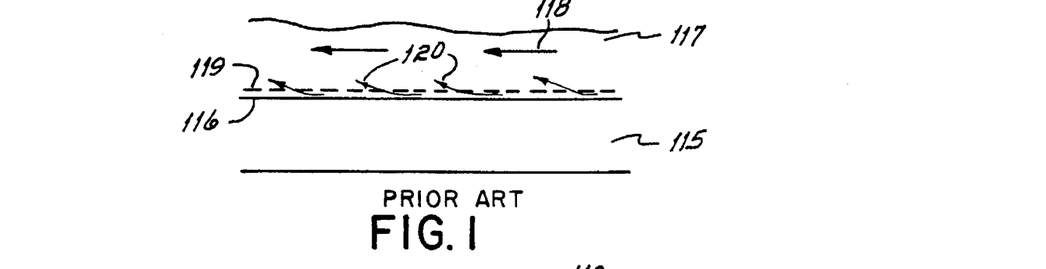
FIG. 1 illustrates prior art cooling of a sputtering target or backing plate.

FIG. 1 illustrates normal cooling per the prior art sputtering cathode assembly. A sputtering target or backing plate 115 has a cooling surface 116 in contact with coolant 117 which flows generally in direction 118 from an inlet to an outlet. Heat from surface 116 flows into boundary layer 119 of the flowing coolant which then disperses 120 into the volume of coolant 117.

Figure 2:
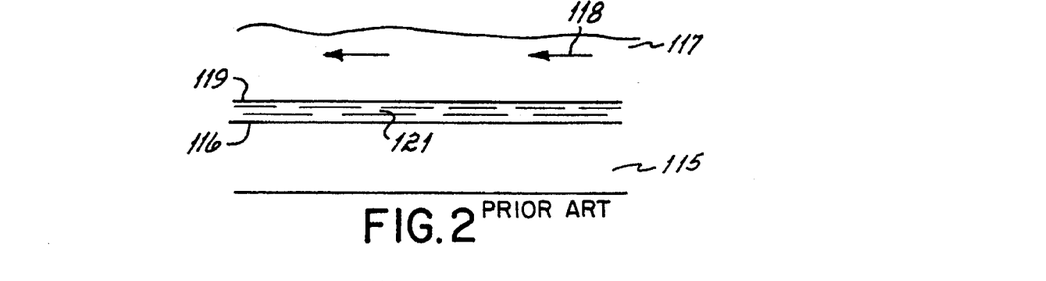
FIG. 2 illustrates the detrimental effect of simply reducing water flow in the cooling system of FIG. 1 in attempting to take advantage of the latent heat of vaporization of water.

FIG. 2 illustrates the detrimental effect of simply reducing the water flow in the system of FIG. 1. Heat from surface 116 boils the boundary layer 119 of coolant, creating an insulating layer 121 of vapor which inhibits heat flow from the surface 116 and permits overheating of target 115. This may occur over the entire target surface or in certain areas only, creating localized hot spots.

It is therefore an objective of the present invention to provide a method for reducing the amount of water required to cool a sputtering target.

It is another objective of the present invention to provide apparatus for cooling a sputtering target utilizing a reduced amount of water to cool the sputtering target.

It is yet another objective of the present invention to provide method and apparatus for cooling a sputtering target which takes advantage of the latent heat of vaporization of water to increase the heat absorption of a given amount of water yet which prevents overheating of the target.

SUMMARY OF THE INVENTION

The present invention attains the stated objectives by providing both method and apparatus for cooling a sputtering target. The method comprises the steps of providing a sputtering target and a cooling surface in operable conductive heat transfer contract with the sputtering target, introducing a cooling liquid onto the cooling surface to conductively remove heat from the sputtering target, allowing at least a portion of the cooling liquid to change phase into a vapor, and preventing a continuous insulating vapor layer from forming on the cooling surface to ensure continuing conductive heat transfer from the target to the cooling surface so as to avoid overheating of the target.

The cooling surface is either the rear surface of the target, the rear surface of a backing plate to which the target is attached and hence which is in operable conductive heat transfer contact with the target, or a surface of a sputtering cathode structure to which the target is attached and hence which is in operable conductive heat transfer contact with the target.

The step of preventing a continuous insulating vapor layer from forming on the cooling surface is performed by agitating the cooling liquid as it comes into contact with the cooling surface. Agitation of the cooling liquid may be performed by at least three methods. One method comprises providing an aperture plate spaced from the cooling surface and which includes a plurality of apertures therein, and flowing the cooling liquid over the aperture plate to create high velocity jets of cooling liquid exiting the apertures which impinge forcefully on the cooling surface and which penetrate any insulating vapor layer on the cooling surface. A second method comprises providing an array of nozzles spaced from the cooling surface, and supplying cooling liquid to the array of nozzles to create a spray exiting the nozzles which impinges forcefully on the cooling surface and which penetrates any insulating vapor layer on the cooling surface. A third method comprises providing a plurality of deflecting surfaces spaced from the cooling surface and flowing the cooling liquid over the deflecting surfaces to create localized flows of cooling liquid from the deflecting surfaces which impinge forcefully on the cooling surface and which penetrate any insulating vapor layer on the cooling surface.

With respect to this third method of agitating the cooling liquid as it comes into contact with the cooling surface, increased agitation may be provided by moving the deflecting surfaces relative to the cooling surface to increase the agitation of the localized flows of cooling liquid which impinge on the cooling surface.

The present invention also provides apparatus for cooling a sputtering target. The apparatus comprises a cooling surface in operable conductive heat transfer contact with the sputtering target to conductively remove heat from the target when a cooling liquid is introduced onto the cooling surface, and means for allowing at least a portion of the cooling liquid to change phase into a vapor while preventing a continuous insulating vapor layer from forming on the cooling surface to ensure continuing conductive heat transfer from the target to the cooling surface so as to avoid overheating of the target.

The cooling surface is either the rear surface of the target, the rear surface of a backing plate to which the target is attached and hence which is in operable conductive heat transfer contact with the target, or a surface of a sputtering cathode structure to which the target is attached and hence which is in operable conductive heat transfer contact with the target.

The means for allowing at least a portion of the cooling liquid to change phase into a vapor layer while preventing a continuous insulating vapor layer from forming on the cooling surface agitates the cooling liquid and takes the form of either an aperture plate spaced from the cooling surface and including a plurality of apertures therein for creating high velocity cooling liquid jets, an array of nozzles spaced from the cooling surface for creating a spray or a plurality of deflecting surfaces spaced from the cooling surface for creating localized flows of cooling liquid from the deflecting surfaces. The apparatus may further comprise means for moving the deflecting surfaces relative to the cooling surface to further increase agitation of the localized flows of cooling liquid.

The main advantage of the present invention is that both method and apparatus for cooling a sputtering target are provided which provide for a substantial reduction in the quantity of water required to cool the target as compared to traditional cooling techniques.

These and other objects and advantages of the present invention will become more readily apparent during the following detailed description taken in conjunction with the drawings herein, in which:

DETAILED DESCRIPTION OF THE INVENTION

Sputtering machines of the type to which the present invention relates are described in the following commonly assigned U.S. patents and copending patent applications which are hereby expressly incorporated in their entirety into this application by reference:

U.S. Pat. Nos. 4,909,695 and 4,915,564 entitled "Method and Apparatus for Handling and Processing Wafer-Like Materials";

U.S. Pat. No. 4,957,605 entitled "Method and Apparatus for Sputter Coating Stepped Wafers"; and U.S. Pat. No. 5,130,005 entitled "Magnetron Sputter Coating Method And Apparatus With Rotating Magnet Structure."

Figure 3:
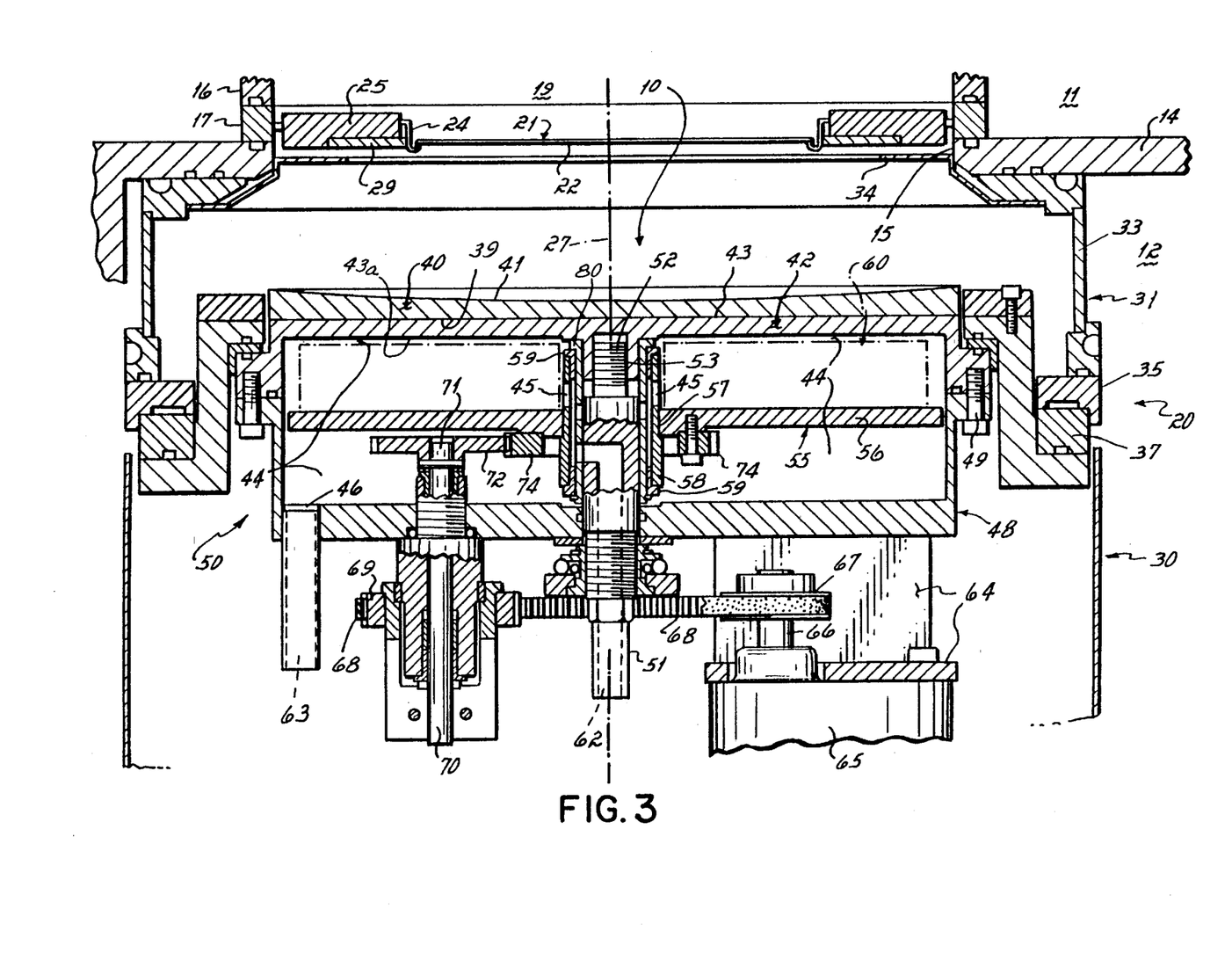
FIG. 3 is a cross-sectional view through a sputter coating processing chamber which may include the principles of the present invention.

FIG. 3 illustrates, in cross-section, a sputter coating processing chamber 10 of a sputter coating apparatus which may include the principles of the present invention. The chamber 10 is a portion of the sputter processing apparatus disclosed in U.S. Pat. No. 4,909,695. The processing chamber 10 is a vacuum processing chamber formed of an isolated section of a main chamber 11. The main chamber 11 is isolated from the atmosphere or the machine environment 12 by a plenum wall 14. The processing chamber 10 is capable of communicating with the main chamber 11 through opening 15 (shown sealed) in the plenum wall 14.

As more fully described in U.S. Pat. No. 4,909,695, the sealing of the opening 15 isolates the chamber 10 from the main chamber 11 by the selective movement of a processing chamber backplane section 16 against a portion of a disk shaped rotary wafer transport member 17 clamping the transport member 17 between the backplane section 16 and the plenum wall 14 in a sealing relationship (as shown), thereby enclosing a backplane space 19 within the processing chamber 10 and isolating the processing chamber 10 from the main chamber 11.

Opposite the backplane section 16, on the front plane side of the transport member 17, the processing chamber 10 is isolated from the atmosphere or machine environment 12 with a cathode assembly module 20 mounted in a vacuum sealing relationship against the process chamber wall 33 surrounding the opening 15. The module 20, or processing chamber frontplane section, cooperates with the backplane section 16 and the transport member 17 to form the sealed isolated processing chamber which is isolated from both the main chamber 11 and the atmosphere or machine external environment 12.

Within the processing chamber 10 is a substrate or workpiece 21 in the form of a flat silicon wafer or disk which has the surface 22 upon which a coating is to be deposited in a sputter coating process to be performed within the processing chamber 10. The wafer 21 is held by a set of clips or other retaining devices 24 in a wafer holder 25 resiliently carried by the transport member 17. The transport member 17 is rotatable within the main chamber to bring the holder 25, and the workpiece or wafer 21 into alignment with the hole 15 so that the processing chamber 10 can be formed around the wafer 21 on the holder 25 by transverse movement of the backplane section 16 to move the member 17 against the plenum wall 14. The transport member portion 17 is a transversely movable ring carried by a rotatable index plate which is not shown, but described more fully in the above incorporated U.S. Pat. Nos. 4,909,675 and 4,915,564.

The wafer 21 is supported in a plane perpendicular to, and concentric with, a central axis 27 of the main chamber 10, which is also concentric with the hole 15 in the plenum wall 14. Surrounding the wafer 21 on the holder 25 is a shield 34 which at least partially protects the holder 25 from an excessive accumulation of coating which missed the surface 22 of the wafer 21. Details of the sputtering apparatus of which the processing chamber 10 is a part including particularly details of the wafer transport 17, wafer holder 25, and backplane section 16, are described and illustrated in U.S. Pat. Nos. 4,909,695 and 4,915,564 incorporated by reference above.

The cathode assembly module 20 is mounted to a fixed process chamber assembly portion 31. The fixed assembly portion 31 is an enclosure rigidly mounted in sealed relationship against the plenum wall 14 surrounding the opening 15. It includes a cylindrical metal side wall 33 of the chamber 10, which is electrically grounded to the wall 14 of the plenum, a wafer holder shield 34 which surrounds the opening 15 and a chamber door frame assembly 35.

The cathode assembly 50 is mounted to a hinged door assembly 37 which removably but sealably supports the cathode assembly 50 to the fixed assembly 31. The cathode assembly 50 carries the sputtering target 40, which is a circular target having a continuous smooth concave sputtering surface 41 and a back surface 39. The assembly 50 supports the target 40 with its axis in alignment with the axis 27 of the chamber 10 and with its sputtering surface 41 facing the surface 22 of the wafer 21 to be coated.

The target 40 is supported in a target nest, holder or backing plate 42 having a front surface 43 conforming to surface 39 and concentric with axis 27. The back surface 39 of the target 40 is soldered or otherwise bonded to the front surface 43 of the backing plate 42, in intimate thermal contact therewith. The target back surface 39 is a cooling surface which, when the target 40 is mounted in backing plate 42, conforms to and lies in close cooling contact with the surface 43 of the backing plate 42. Behind the backing plate 42, opposite the front cooling surface 43 thereof, is a space 44 for the circulation of cooling liquid, which is generally water, to remove heat generated in the target 40 during sputtering by cooling the rear cooling surface 43a of the heat conductive backing plate 42. Cooling surface 43a, while not in direct contact with the target 40, is nevertheless in operable conductive heat transfer contact with target 40. The cooling fluid is circulated into and out of the space 44 from an inlet port 45 to an outlet port 46 in cathode assembly 50, as described below. The space 44 is enclosed behind the backing plate 42 by a housing structure 48 onto which the backing plate 42 is rigidly supported, and to which it is secured by bolts 49.

The shapes of the surfaces of the target 40 are preferably such that the target 40 is capable of being formed by turning a block of sputtering material on a lathe. The backing plate 42 is made of a heat conductive and electrically conductive material, preferably hard tempered OFHC copper or Alloy 110.

The cathode assembly 50 includes a shaft 51 having a threaded end 52 by which the shaft 51 is rigidly mounted in a threaded bore 53 at the center of the back surface of the backing plate 42. The assembly 50 also includes a rotatable magnet carrier assembly 55 which includes a circular disk 56 of non-magnetic stainless steel or other such material having a central hole 57 therein at which the disk 56 is rigidly mounted to a sleeve assembly 58 rotatably mounted through a bearing assembly 59 through the housing 48 and to the backing plate 42 to rotate about the shaft 51 on the axis 27. The cathode assembly 50 further includes a magnet structure 60 rigidly mounted on the disk 56 to rotate therewith. The magnet 60 surrounds the axis 27 and lies beneath or behind the backing plate 42, opposite the front surface 43 thereof, and close enough thereto to generate a closed magnetic field above the sputtering surface 41 of the target 40 mounted on the surface 43 of the backing plate 42.

The shaft 51 has a cooling fluid inlet duct 62 extending therethrough which communicates with the inlet port 45 to the interior cooling chamber 44 between the backing plate 42 and the housing 48. The housing 48 has mounted near the edge thereof a cooling fluid outlet duct 63 which communicates with the fluid outlet port 46 in the cooling space 44.

Mounted to the back of the housing 48 is a bracket 64 to which is mounted a magnet rotary drive motor 65. The motor 65 has an output shaft 66 with a cogged drive wheel 67 mounted at the end thereof for driving a cogged drive belt 68. The belt 68 extends around a cogged drive wheel 69 attached to a drive shaft 70 which is rotatably mounted on the housing 48 extending therethrough and having a free end 71 to which is mounted a drive gear 72. The drive gear 72 is positioned within the space 44 where it engages a mating gear 74 attached to the disk 56 of the rotatable magnet assembly 55. Accordingly, the motor 65, when energized, rotates the magnet assembly 55 to rotate the magnet 60 behind the backing plate 42 to rotate the magnetic field over the sputtering surface 41 of the target 40.

Figure 4:
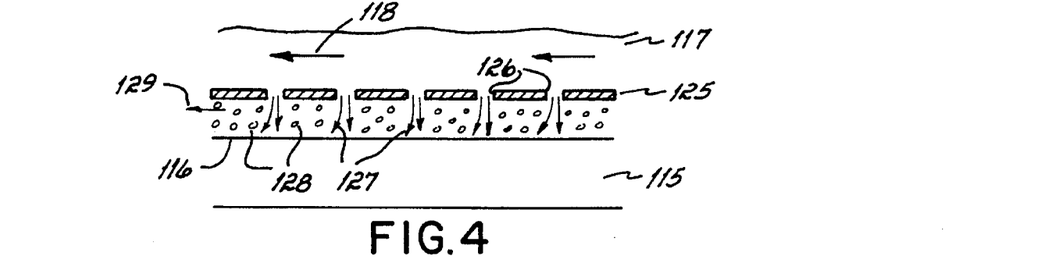
FIG. 4 is a cross-sectional view of one embodiment of the present invention.

Referring now to FIG. 4, one embodiment of the present invention which may be incorporated in the sputtering apparatus of FIG. 3 is illustrated. As shown in FIG. 4, coolant 117 is admitted at a coolant inlet, for example inlet 62 shown in FIG. 3, and flows in the direction 118 generally across an aperture plate 125 which is spaced from the cooling surface 116. Cooling surface 116 may either be the rear surface of the sputtering target, the rear surface of a backing plate to which the sputtering target is attached (for example rear surface 43a of backing plate 42 shown in FIG. 3), or a surface of a sputtering cathode to which the sputtering target is attached. As previously described, in the latter two instances, while cooling surface 116 would not be in direct contact with the target as it would were it the rear face of the target, the cooling surface 116 is nevertheless in operable conductive heat transfer contact with the target.

Figure 7:
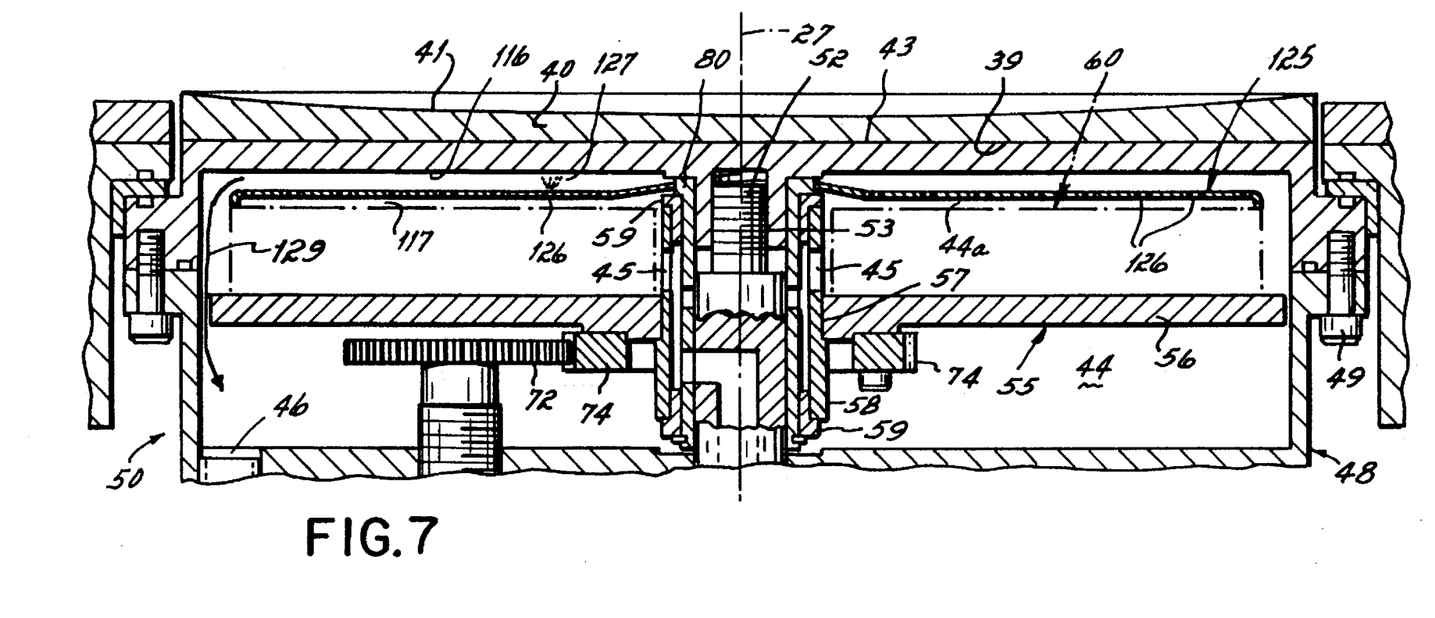
FIG. 7 is a fragmentary view of a portion of FIG. 3 illustrating one embodiment of the present invention incorporated into a sputter coating processing chamber.

Referring now to FIG. 7, and with like numbers representing like elements, aperture plate 125 may be mounted in cooling chamber 44 by attachment to fixed sleeve 80. Alternatively, plate 125 may be a part of rotatable magnet 60. Once mounted in cooling chamber 44, aperture plate 125 is positioned intermediate cooling surface 116 and rotating magnet 60, forming coolant flow space 44a between plate 125 and magnet 60. Coolant thus flows through space 44a, through holes 126 and into contact with cooling surface 116. Alternatively, aperture plate 125 may be incorporated in a cathode structure which does not include rotating magnets. Apertures 126 in aperture plate 125 create high velocity jets 127 of coolant which impinge forcefully on cooling surface 116, thereby penetrating any insulating vapor layer thereon, breaking it up into small vapor bubbles which then flow 129 generally towards coolant vapor outlet 46. For the size of cathode assembly illustrated in FIG. 7, which accepts a target having a diameter of approximately 10 inches, aperture plate 125 is preferably approximately 9½ inches in diameter, and apertures 126 are preferably approximately 0.03 inch in diameter. Aperture plate 125 preferably includes approximately 150 apertures 126, or approximately 2 apertures per square inch. Aperture plate 125 is preferably approximately 0.06 inch thick, and is preferably spaced from cooling surface 116 by approximately 0.1 inch. Jets 127 have a velocity of approximately 365 inches per minute, a total flow rate of approximately 10 gallons per hour, and an inlet pressure of approximately 30 psi. The inlet and outlet temperatures of coolant 117 are approximately 70° F. and 212° F., respectively. The creation of a highly agitated coolant contact with the cooling surface 116 thereby prevents a continuous insulating vapor layer from forming on the cooling surface 116 and ensures continuing conductive heat transfer from the target to the cooling surface 116 so as to avoid overheating of the target.

Figure 5:
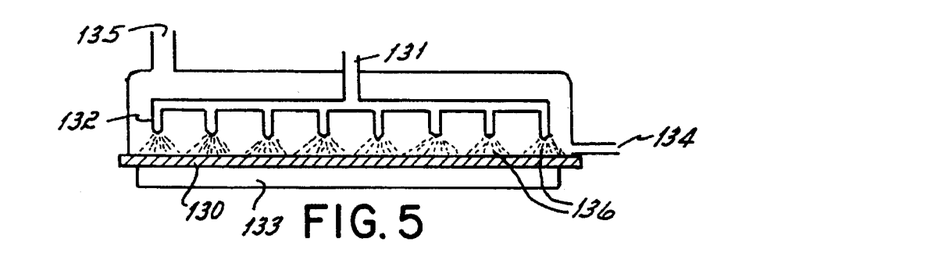
FIG. 5 is a view similar to FIG. 4 but of another embodiment of the present invention.

Another embodiment of the present invention is illustrated in FIG. 5. In this embodiment, a coolant inlet pipe 131 feeds an array of nozzles 132 to be mounted in the cooling chamber of a cathode structure and provide an agitated spray 136 onto cooling surface 116 of a backing plate 130 which is thermally and mechanically bonded to a target 133. When mounted in a cathode structure, nozzles 132 are positioned intermediate cooling surface 116 and the rotating magnet of the cathode; alternatively, the array of nozzles 132 may be incorporated into a cathode structure which does not include rotating magnets. When incorporated into a rotating magnet cathode structure, nozzles 132 may be incorporated into the rotating magnet structure. Cooling surface 116 could also be the rear surface of the target or a surface of a cathode to which the target is attached. Excess liquid coolant is drawn off at liquid outlet 134 while vapor formed by the vaporizing coolant exits at vapor outlet 135. As in the FIG. 4 embodiment, the spray 136 prevents a continuous insulating vapor layer from forming on the cooling surface and ensures continuing conductive heat transfer from the target to the cooling surface so as to avoid overheating of the target.

Figure 6:
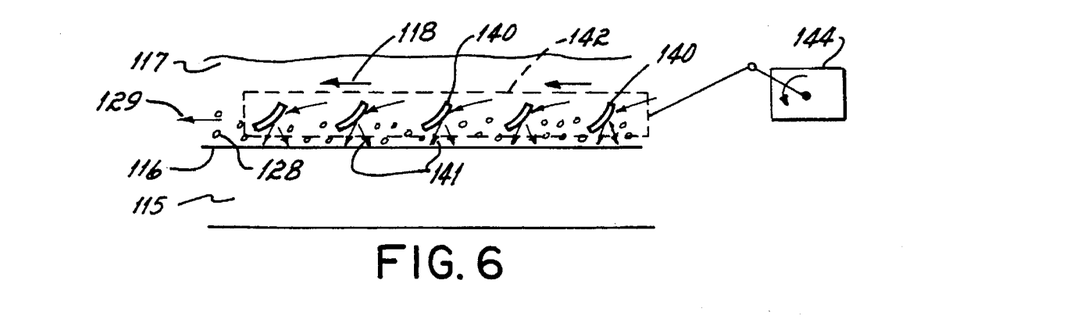
FIG. 6 is a view similar to FIGS. 4 and 5 but of yet another embodiment of the present invention.

FIG. 6 illustrates yet another embodiment of the present invention. A plurality of surfaces 140 is provided to deflect portions of coolant flow 118 creating localized flows 141 which penetrate any insulating vapor barrier atop cooling surface 116, breaking it up into small vapor bubbles 128. The structure 142 to be mounted in the cooling chamber of a cathode structure and containing surfaces 140 may be fixed relative to cooling surface 116; alternatively the surfaces 140 may be moved with respect to surface 116 in order to increase the agitation of localized flows 141 by moving structure 142 relative to surface 116 by any reciprocating means known to those skilled in the art and shown diagrammatically at 144. When mounted in a cathode structure, structure 142 is positioned intermediate cooling surface 116 and the rotating magnet of the cathode. Alternatively, the surfaces 140 could be incorporated into the magnet structure of a rotating magnet assembly to provide rotational movement of the surfaces 140 relative to cooling surface 116. As in the FIGS. 4 and 5 embodiments, the localized flows 141 prevent a continuous insulating vapor layer from forming on the cooling surface and ensure continuing conductive heat transfer from the target to the cooling surface so as to avoid overheating of the target.

Those skilled in the art will readily recognize numerous adaptations and modifications which can be made to the present invention which will result in improved method and apparatus for cooling a sputtering target, yet all of which will fall within the spirit and scope of the present invention as defined in the following claims. Accordingly, the invention is to be limited only by the scope of the following claims and their equivalents.

What is claimed is:

1. A method of cooling a sputtering target, comprising the steps of:
   providing a sputtering target and a cooling surface in operable conductive heat transfer contact with the sputtering target;
   introducing a cooling liquid onto the cooling surface to conductively remove heat from the sputtering target;
   utilizing the latent heat of vaporization of the cooling liquid to remove heat from the target by allowing only a portion of the cooling liquid to change from a liquid phase into a vapor phase; and
   preventing a continuous insulating vapor layer from forming on the cooling surface by flowing an unvaporized portion of the cooling liquid against the cooling surface to ensure continuing conductive heat transfer from the target to the cooling surface so as to avoid overheating of the target.

2. The method of claim 1 wherein the sputtering target has a rear surface and the cooling surface is the sputtering target rear surface.

3. The method of claim 1 wherein the sputtering target is attached to a backing plate having a rear surface and the cooling surface is the backing plate rear surface.

4. The method of claim 1 wherein the sputtering target is attached to a sputtering cathode structure having a surface and the cooling surface is the cathode structure surface.

5. The method of claim 1 further comprising the step of extracting excess cooling liquid and vapor from the cooling surface.

6. The method of claim 1 wherein the cooling liquid is primarily water.

7. The method of claim 1 wherein the step of preventing a continuous insulating vapor layer from forming on the cooling surface is performed by:

agitating the cooling liquid as it comes into contact with the cooling surface.

8. The method of claim 7 wherein agitation of the cooling liquid as it comes into contact with the cooling surface is performed by:

providing an aperture plate spaced from the cooling surface and which includes a plurality of apertures therein; and flowing the cooling liquid over the aperture plate to create high velocity jets of cooling liquid exiting the apertures which impinge forcefully on the cooling surface and which penetrate any insulating vapor layer on the cooling surface.

9. The method of claim 7 wherein agitation of the cooling liquid as it comes into contact with the cooling surface is performed by:

providing an array of nozzles spaced from the cooling surface; and supplying cooling liquid to the array of nozzles to create a spray exiting the nozzles which impinges forcefully on the cooling surface and which penetrates any insulating vapor layer on the cooling surface.

10. A method of cooling a sputtering target, comprising the steps of:

providing a sputtering target and a cooling surface in operable conductive heat transfer contact with the sputtering target;

introducing a cooling liquid onto the cooling surface to conductively remove heat from the sputtering target;

allowing at least a portion of the cooling liquid to change phase into a vapor; and preventing a continuous insulating vapor layer from forming on the cooling surface to ensure continuing conductive heat transfer from the target to the cooling surface so as to avoid overheating of the target by agitating the cooling liquid as it comes into contact with the cooling surface;

wherein agitation of the cooling liquid as it comes into contact with the cooling surface is performed by:

providing a plurality of deflecting surfaces spaced from the cooling surface; and flowing the cooling liquid over the deflecting surfaces to create localized flows of cooling liquid from the deflecting surfaces which impinge forcefully on the cooling surface and which penetrate any insulating vapor layer on the cooling surface.

11. The method of claim 10 wherein increased agitation of the cooling liquid as it comes into contact with the cooling surface is performed by:

moving the deflecting surfaces relative to the cooling surface to increase agitation of the localized flows of cooling liquid which impinge on the cooling surface.

12. Apparatus for cooling a sputtering target, comprising:

a cooling surface in operable conductive heat transfer contact with the sputtering target to conductively remove heat from the target when a cooling liquid is introduced onto said cooling surface; and means utilizing the latent heat of vaporization of the cooling liquid for removing heat from the target by allowing only a portion of the cooling liquid to change from a liquid phase into a vapor phase and for preventing a continuous insulating vapor layer from forming on said cooling surface by flowing an unvaporized portion of the cooling liquid against the cooling surface to ensure continuing conductive heat transfer from the target to said cooling surface so as to avoid overheating of the target.

13. The apparatus of claim 12 wherein the sputtering target has a rear surface and said cooling surface is the sputtering target rear surface.

14. The apparatus of claim 12 wherein the sputtering target is attached to a backing plate having a rear surface and said cooling surface is the backing plate rear surface.

15. The apparatus of claim 12 wherein the sputtering target is attached to a sputtering cathode structure having a surface and the cooling surface is the cathode structure surface.

16. The method of claim 12 further comprising the step of extracting excess cooling liquid and vapor from the cooling surface.

17. The method of claim 12 wherein the cooling liquid is primarily water.

18. The apparatus of claim 12 wherein said means for allowing at least a portion of the cooling liquid to change phase into a vapor while preventing a continuous insulating vapor layer from forming on said cooling surface agitates the cooling liquid as it comes into contact with said cooling surface.

19. The apparatus of claim 12 wherein said means for allowing at least a portion of the cooling liquid to change phase into a vapor while preventing a continuous insulating vapor layer from forming on said cooling surface comprises:

an aperture plate spaced from said cooling surface and which includes a plurality of apertures therein;

the cooling liquid flowing over said aperture plate creating high velocity jets of cooling liquid exiting said apertures which impinge forcefully on said cooling surface and which penetrate any insulating vapor layer on said cooling surface.

20. The apparatus of claim 12 wherein said means for allowing at least a portion of the cooling liquid to change phase into a vapor while preventing a continuous insulating vapor layer from forming on said cooling surface comprises:

an array of nozzles spaced from said cooling surface;

the cooling liquid being supplied to said array of nozzles to create a spray exiting said nozzles which impinges forcefully on said cooling surface and which penetrates any insulating vapor layer on said cooling surface.

21. Apparatus for cooling a sputtering target, comprising:

a cooling surface in operable conductive heat transfer contact with the sputtering target to conductively remove heat from the target when a cooling liquid is introduced onto said cooling surface; and means for allowing at least a portion of the cooling liquid to change phase into a vapor while preventing a continuous insulating vapor layer from forming on said cooling surface to ensure continuing conductive heat transfer from the target to said cooling surface so as to avoid overheating of the target;

wherein said means for allowing at least a portion of the cooling liquid to change phase into a vapor while preventing a continuous insulating vapor layer from forming on said cooling surface comprises:

a plurality of deflecting surfaces spaced from said cooling surface; and the cooling liquid flowing over said deflecting surfaces to create localized flows of cooling liquid from said deflecting surfaces which impinge forcefully on said cooling surface and which penetrate any insulating vapor layer on said cooling surface.

22. The apparatus of claim 21 further comprising:

means for moving said deflecting surfaces relative to said cooling surface to increase agitation of the localized flows of cooling liquid which impinge on said cooling surface.

23. Apparatus for cooling a sputtering target, comprising:

a cooling surface in operable conductive heat transfer contact with the sputtering target to conductively remove heat from the target when a cooling liquid is introduced onto said cooling surface; and an aperture plate spaced from said cooling surface and which includes a plurality of apertures therein;

said apparatus utilizing the latent heat of vaporization of the cooling liquid to remove heat from the target by allowing only a portion of the cooling liquid to change from a liquid phase into a vapor phase, an unvaporized portion of the cooling liquid flowing over said aperture plate creating high velocity jets of cooling liquid exiting said apertures which impinge forcefully on said cooling surface and which penetrate any insulating vapor layer on said cooling surface.

24. Apparatus for cooling a sputtering target, comprising:

a cooling surface in operable conductive heat transfer contact with the sputtering target to conductively remove heat from the target when a cooling liquid is introduced onto said cooling surface; and an array of nozzles spaced from said cooling surface;

said apparatus utilizing the latent heat of vaporization of the cooling liquid to remove heat from the target by allowing only a portion of the cooling liquid to change from a liquid phase into a vapor phase, an unvaporized portion of the cooling liquid being supplied to said array of nozzles to create a spray exiting said nozzles which impinges forcefully on said cooling surface and which penetrates any insulating vapor layer on said cooling surface.

25. Apparatus for cooling a sputtering target comprising:

a cooling surface in operable conductive heat transfer contact with the sputtering target to conductively remove heat from the target when a cooling liquid is introduced onto said cooling surface; and a plurality of deflecting surfaces spaced from said cooling surface;

the cooling liquid flowing over said deflecting surfaces to create localized flows of cooling liquid from said deflecting surfaces which impinge forcefully on said cooling surface and which penetrate any insulating vapor layer on said cooling surface.

26. Sputter coating apparatus comprising:

a cathode assembly attached to a processing chamber;

a sputtering target attached to said cathode assembly;

a plasma generator forming a part of said cathode assembly for generating plasma from said target to be deposited onto a substrate adjacent said target;

a cooling surface in operable conductive heat transfer contact with said sputtering target to conductively remove heat from said target when a cooling liquid is introduced onto said cooling surface; and means utilizing the latent heat of vaporization of the cooling liquid for removing heat from the target by allowing only a portion of the cooling liquid to change from a liquid phase into a vapor phase and for preventing a continuous insulating vapor layer from forming on said cooling surface by flowing an unvaporized portion of the cooling liquid against the cooling surface to ensure continuing conductive heat transfer from said target to said cooling surface so as to avoid overheating of the target.

27. The apparatus of claim 26 wherein said means for allowing at least a portion of the cooling liquid to change phase into a vapor while preventing a continuous insulating vapor layer from forming on said cooling surface comprises:

an aperture plate spaced from said cooling surface and which includes a plurality of apertures therein;

the cooling liquid flowing over said aperture plate creating high velocity jets of cooling liquid exiting said apertures which impinge forcefully on said cooling surface and which penetrate any insulating vapor layer on said cooling surface.

28. The apparatus of claim 26 wherein said means for allowing at least a portion of the cooling liquid to change phase into a vapor while preventing a continuous insulating vapor layer from forming on said cooling surface comprises:

an array of nozzles spaced from said cooling surface;

the cooling liquid being supplied to said array of nozzles to create a spray exiting said nozzles which impinges forcefully on said cooling surface and which penetrates any insulating vapor layer on said cooling surface.

29. Sputter coating apparatus comprising:

a cathode assembly attached to a processing chamber;

a sputtering target attached to said cathode assembly;

a plasma generator forming a part of said cathode assembly for generating plasma from said target to be deposited onto a substrate adjacent said target;

a cooling surface in operable conductive heat transfer contact with said sputtering target to conductively remove heat from said target when a cooling liquid is introduced onto said cooling surface; and means for allowing at least a portion of the cooling liquid to change phase into a vapor while preventing a continuous insulating vapor layer from forming on said cooling surface to ensure continuing conductive heat transfer from said target to said cooling surface so as to avoid overheating of the target;

wherein said means for allowing at least a portion of the cooling liquid to change phase into a vapor while preventing a continuous insulating vapor layer from forming on said cooling surface comprises:

a plurality of deflecting surfaces spaced from said cooling surface; and the cooling liquid flowing over said deflecting surfaces to create localized flows of cooling liquid from said deflecting surfaces which impinge forcefully on said cooling surface and which penetrate any insulating vapor layer on said cooling surface.

30. Apparatus for cooling a sputtering target, comprising:

a cooling surface in operable conductive heat transfer contact with the sputtering target to conductively remove heat from the target when a cooling liquid is introduced onto said cooling surface; and a cooling liquid circulator having an inlet connected to a source of cooling liquid and an outlet communicating with said cooling surface, said circulator providing a flow of cooling liquid to said cooling surface at a rate which allows only a portion of said cooling liquid to change from a liquid phase into a vapor phase proximate said cooling surface to thereby utilize the latent heat of vaporization of the cooling liquid for removing heat from the target;

said cooling liquid circulator including a cooling liquid flow director for directing cooling liquid against said cooling surface to thereby prevent formation of a continuous insulating vapor layer proximate said cooling surface to ensure continuing conductive heat transfer from the target to said cooling surface so as to avoid overheating of the target.

31. The apparatus of claim 30 wherein the flow rate of said cooling liquid from said circulator is about 10 gallons per hour.

32. The apparatus of claim 30 wherein the flow rate of said cooling liquid from said circulator is 9.9 gallons per hour.

33. The apparatus of claim 30 wherein said circulator comprises:

an aperture plate spaced from said cooling surface and which includes a plurality of apertures therein;

the cooling liquid flowing over said aperture plate creating high velocity jets of cooling liquid exiting said apertures which impinge forcefully on said cooling surface and which penetrate any insulating vapor layer on said cooling surface.

34. The apparatus of claim 30 wherein said circulator comprises:

an array of nozzles spaced from said cooling surface;

the cooling liquid being supplied to said array of nozzles to create a spray exiting said nozzles which impinges forcefully on said cooling surface and which penetrates any insulating vapor layer on said cooling surface.

35. The apparatus of claim 30 wherein said circulator comprises:

a plurality of deflecting surfaces spaced from said cooling surface;

the cooling liquid flowing over said deflecting surfaces to create localized flows of cooling liquid from said deflecting surfaces which impinge forcefully on said cooling surface and which penetrate any insulating vapor layer on said cooling surface.

36. Sputter coating apparatus comprising:

a cathode assembly attached to a processing chamber;

a sputtering target attached to said cathode assembly;

a plasma generator forming a part of said cathode assembly for generating plasma from said target to be deposited onto a substrate adjacent said target;

a cooling surface in operable conductive heat transfer contact with said sputtering target to conductively remove heat from said target when a cooling liquid is introduced onto said cooling surface; and a cooling liquid circulator having an inlet connected to a source of cooling liquid and an outlet communicating with said cooling surface, said circulator providing a flow of cooling liquid to said cooling surface at a rate which allows only a portion of said cooling liquid to change from a liquid phase into a vapor phase proximate said cooling surface to thereby utilize the latent heat of vaporization of the cooling liquid for removing heat from the target;

said cooling liquid circulator including a cooling liquid flow director for directing cooling liquid against said cooling surface to thereby prevent formation of a continuous insulating vapor layer proximate said cooling surface to ensure continuing conductive heat transfer from the target to said cooling surface so as to avoid overheating of the target.

37. The apparatus of claim 36 wherein the flow rate of said cooling liquid from said circulator is about 10 gallons per hour.

38. The apparatus of claim 36 wherein the flow rate of said cooling liquid from said circulator is 9.9 gallons per hour.

39. The apparatus of claim 36 wherein said circulator comprises:

an aperture plate spaced from said cooling surface and which includes a plurality of apertures therein;

the cooling liquid flowing over said aperture plate creating high velocity jets of cooling liquid exiting said apertures which impinge forcefully on said cooling surface and which penetrate any insulating vapor layer on said cooling surface.

40. The apparatus of claim 36 wherein said circulator comprises:

an array of nozzles spaced from said cooling surface;

the cooling liquid being supplied to said array of nozzles to create a spray exiting said nozzles which impinges forcefully on said cooling surface and which penetrates any insulating vapor layer on said cooling surface.

41. The apparatus of claim 36 wherein said circulator comprises:

a plurality of deflecting surfaces spaced from said cooling surface;

the cooling liquid flowing over said deflecting surfaces to create localized flows of cooling liquid from said deflecting surfaces which impinge forcefully on said cooling surface and which penetrate any insulating vapor layer on said cooling surface.

* * * * *

UNITED STATES PATENT AND TRADEMARK OFFICE
CERTIFICATE OF CORRECTION

PATENT NO. : 5,569,361
DATED : October 29, 1996
INVENTOR(S) : Steven Hurwitt

It is certified that error appears in the above-indentified patent and that said Letters Patent is hereby corrected as shown below:

Column 3, line 7 should read -- contact -- instead of "contract".

Signed and Sealed this

Eighteenth Day of November 1997

Attest:

BRUCE LEHMAN

*Attesting Officer*   *Commissioner of Patents and Trademarks*